(12) United States Patent
Ohno et al.

(10) Patent No.: US 10,778,221 B2
(45) Date of Patent: Sep. 15, 2020

(54) HIGH-FREQUENCY INTEGRATED CIRCUIT

(71) Applicants: Kabushiki Kaisha Toshiba, Minato-ku, Tokyo (JP); Toshiba Electronic Devices & Storage Corporation, Minato-ku, Tokyo (JP)

(72) Inventors: Shinji Ohno, Kawasaki Kanagawa (JP); Toshifumi Ishimori, Yokohama Kanagawa (JP); Mitsuru Sugawara, Yokohama Kanagawa (JP)

(73) Assignees: Kabushiki Kaisha Toshiba, Tokyo (JP); Toshiba Electronics Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/433,134

(22) Filed: Jun. 6, 2019

(65) Prior Publication Data

US 2020/0228117 A1 Jul. 16, 2020

(30) Foreign Application Priority Data

Jan. 10, 2019 (JP) ................................ 2019-002511

(51) Int. Cl.
*H03K 17/693* (2006.01)
*H03H 11/34* (2006.01)

(52) U.S. Cl.
CPC ......... *H03K 17/693* (2013.01); *H03H 11/346* (2013.01)

(58) Field of Classification Search
CPC .......................... H03K 17/693; H03H 11/346
See application file for complete search history.

(56) References Cited

U.S. PATENT DOCUMENTS

| 5,878,331 A | 3/1999 | Yamamoto et al. |
| 8,129,787 B2* | 3/2012 | Brindle ............. H01L 29/78609 257/347 |
| 9,917,575 B2* | 3/2018 | Solomko .......... H03K 17/04206 |
| 2003/0039280 A1* | 2/2003 | Mangano ............... H01S 5/0428 372/38.02 |
| 2018/0083610 A1 | 3/2018 | Ishii et al. |

FOREIGN PATENT DOCUMENTS

| JP | H09-200021 A | 7/1997 |
| JP | 4804142 B2 | 11/2011 |
| JP | 2018-121386 A | 8/2018 |
| WO | 2016-181597 A1 | 11/2016 |

* cited by examiner

*Primary Examiner* — Dinh T Le
(74) *Attorney, Agent, or Firm* — White & Case LLP

(57) ABSTRACT

According to one embodiment, a first switch controls conduction between first and second nodes according to a potential on a first control node. A second switch controls conduction between the first control node and a first potential node according to a potential on a second control node. A first circuit includes first and second output nodes respectively coupled to the first and second control nodes, and outputs at the second output node a potential that brings the second switch out of conduction while outputting a first potential at the first output node. The first circuit has a high impedance at the first output node while outputting at the second output node a potential that brings the second switch into conduction.

15 Claims, 10 Drawing Sheets

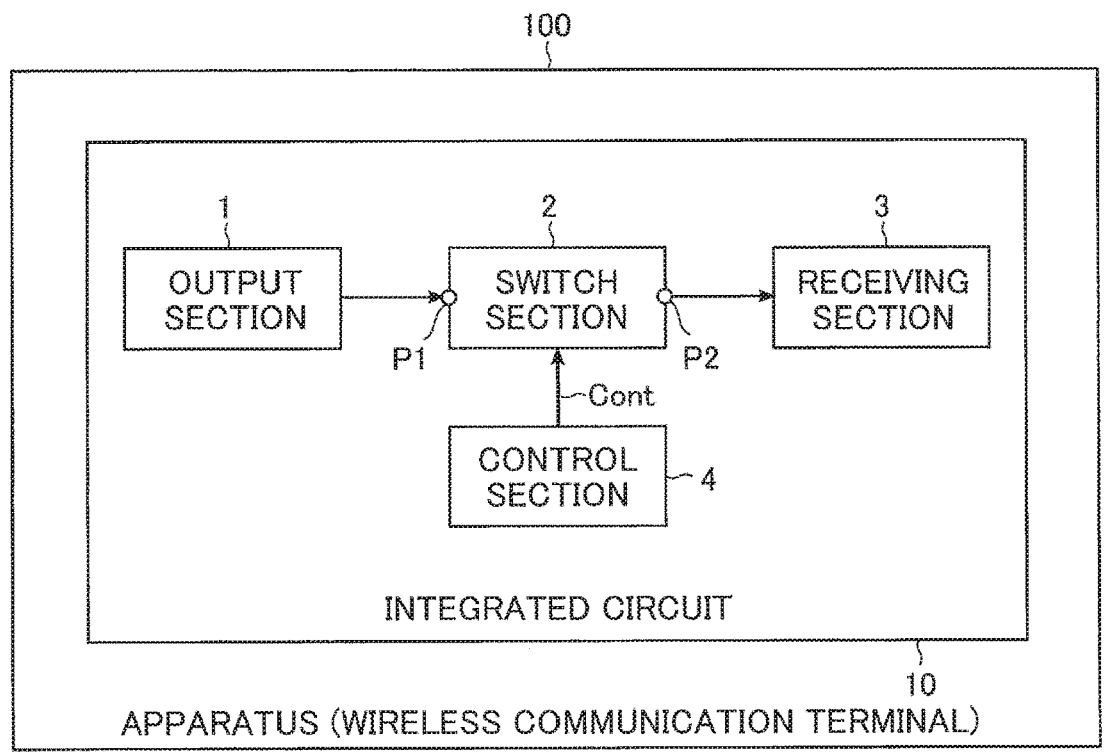
F I G. 1
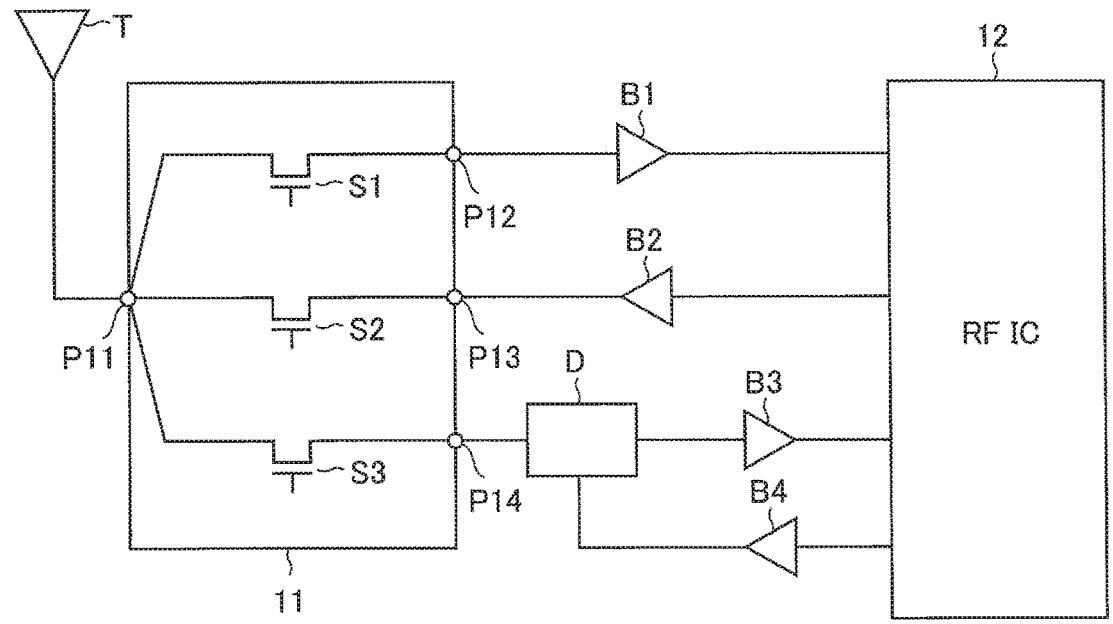
F I G. 2

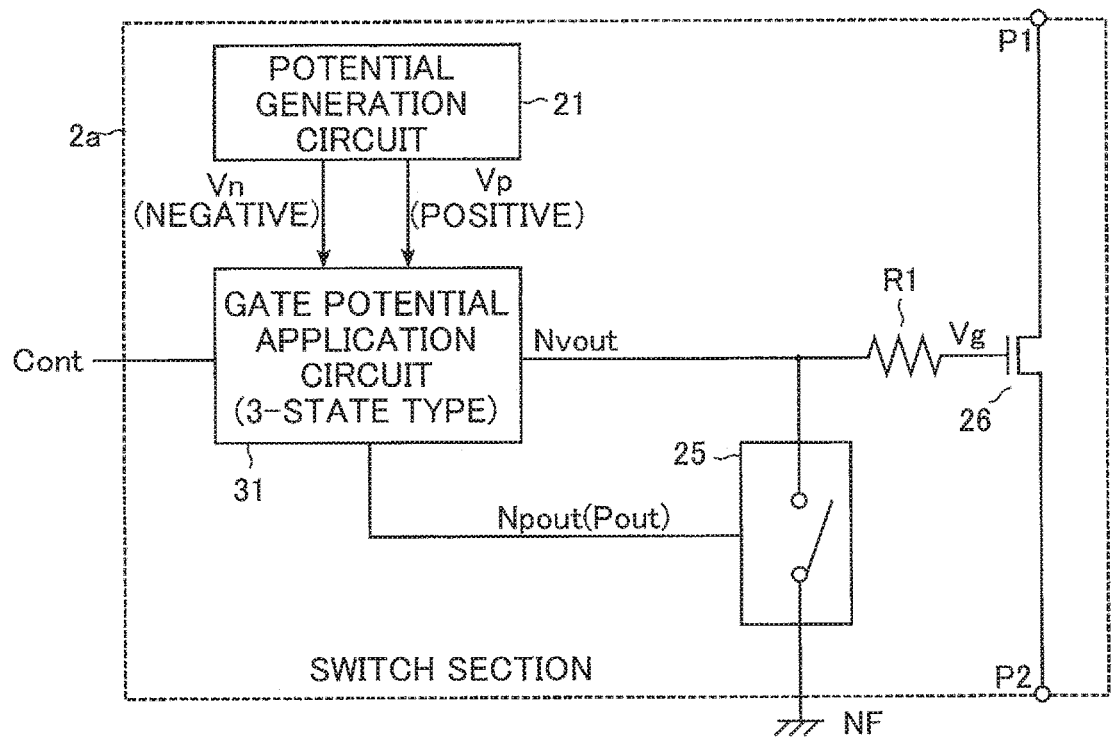
F I G. 11
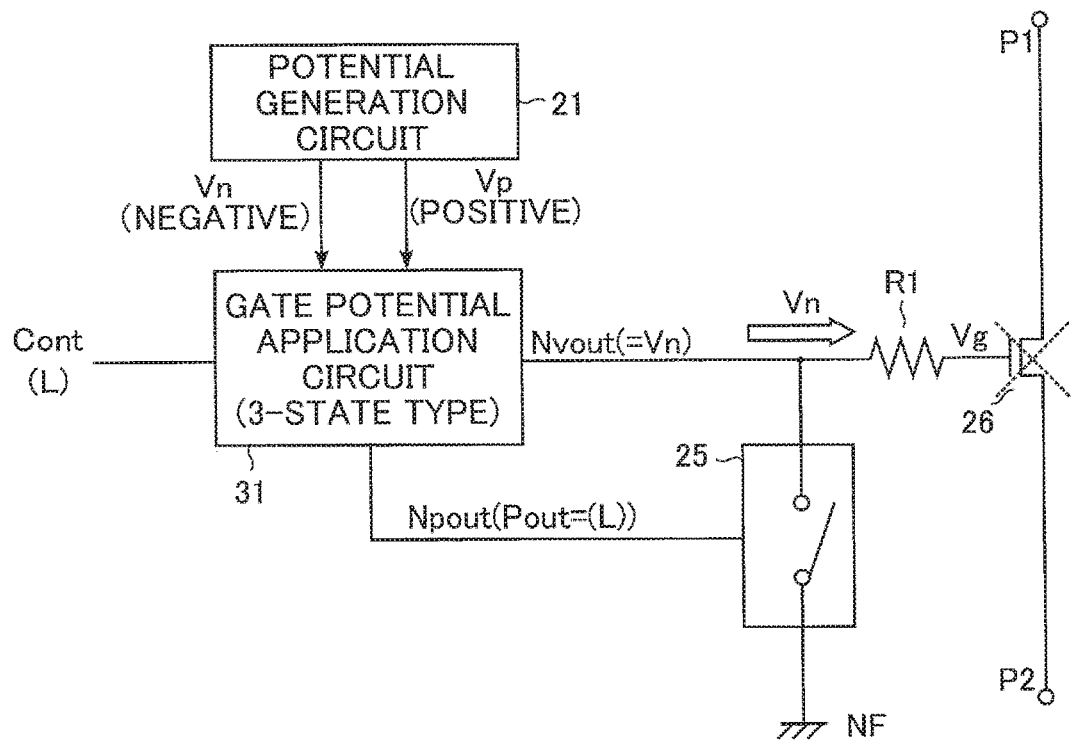
F I G. 12

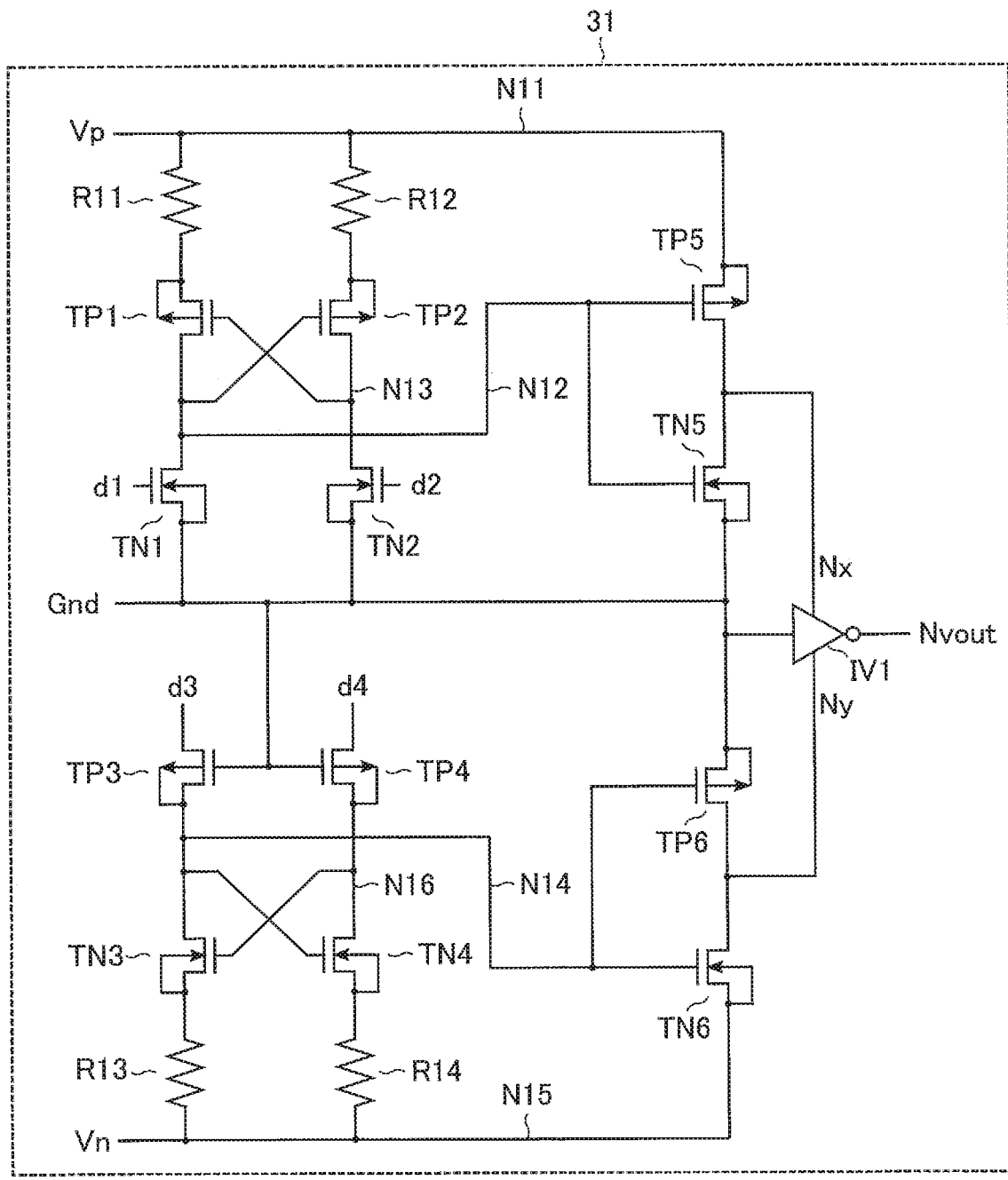
F I G. 15

HIGH-FREQUENCY INTEGRATED CIRCUIT

CROSS-REFERENCE TO RELATED APPLICATIONS

This application is based upon and claims the benefit of priority from Japanese Patent Application No. 2019-2511, filed Jan. 10, 2019, the entire contents of which are incorporated herein by reference.

FIELD

Embodiments described herein relate generally to a high-frequency integrated circuit.

BACKGROUND

A high-frequency integrated circuit including a switch circuit for switching between signal paths is used in a wireless communication terminal such as a smartphone.

BRIEF DESCRIPTION OF THE DRAWINGS

FIG. 1 shows functional blocks of an integrated circuit according to a first embodiment.

FIG. 2 shows an example of an application of the integrated circuit according to the first embodiment.

FIG. 11 shows details of a switch section according to a second embodiment.

FIG. 12 shows a state of the switch section in operation according to the second embodiment.

FIG. 15 is a circuit diagram illustrating a part of an example of a gate potential application circuit according to the second embodiment.

DETAILED DESCRIPTION

Figure 3:
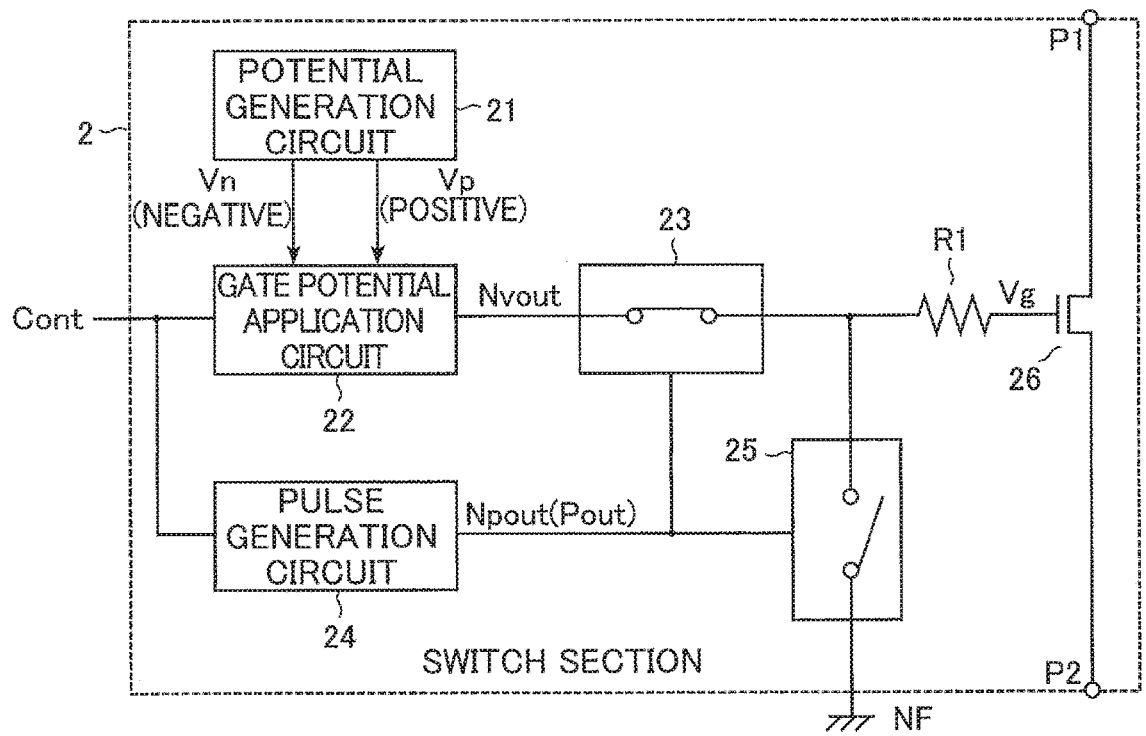
FIG. 3 shows details of the switch section according to the first embodiment.

In general, according to one embodiment, a high-frequency integrated circuit includes: a first switch circuit, a second switch, and a first circuit. The first switch circuit controls conduction between a first node and a second node according to a potential applied to a first control node. The second switch circuit controls conduction between the first control node and a first potential node according to a potential applied to a second control node. The first circuit includes a first output node coupled to the first control node and a second output node coupled to the second control node, and outputs, at the second output node, a potential that brings the second switch circuit out of conduction during a period of outputting a first potential at the first output node. The first circuit has a high impedance at the first output node as compared to an impedance during the period of outputting the first potential at the first output node during a period of outputting, at the second output node, a potential that brings the second switch circuit into conduction.

Embodiments will now be described with reference to the figures. In the following description, components with substantially the same functionalities and configurations will be referred to with the same reference numerals, and repeated descriptions may be omitted. Moreover, the entire description for a particular embodiment also applies to another embodiment unless explicitly mentioned otherwise or obviously eliminated.

Each functional block can be implemented as hardware, computer software, or combination of the both. For this reason, in order to clearly illustrate that each block can be any of hardware, software or a combination thereof, descriptions will be made in terms of their functionalities in general.

In the specification and the claims, a phrase of a particular first component being "coupled" to another second component includes the first component being coupled to the second component either directly or via one or more components which are always or selectively conductive.

First Embodiment

<1. 1. Configuration>

FIG. 1 shows functional blocks included in an integrated circuit according to a first embodiment. An integrated circuit 10 is formed as, for example, a semiconductor chip, and is included in an apparatus 100, which is, for example, a wireless communication terminal such as a smartphone. The integrated circuit 10 can be used in, for example, a Long Term Evolution (LTE) and/or WiFi wireless communication terminal.

The integrated circuit 10 includes an output section 1, a switch section 2, a receiving section 3, and a control section 4. The output section 1 outputs a signal of any type. The signal output from the output section 1 is supplied to a first port (or a terminal or a node) P1 of the switch section 2. The switch section 2 includes the first port P1 and a second port P2, receives a control signal Cont, and controls the first port P1 and the second port P2 to be brought into conduction (i.e., coupled) or out of conduction (i.e., non-coupled or decoupled) based on the control signal Cont. The control signal Cont is supplied from the control section 4. The second port P2 of the switch section 2 is coupled to the receiving section 3. The receiving section 3 receives a signal from the second port P2.

The output section 1 and the receiving section 3 may be any combination of circuits that respectively output and receive signals of any types. The output section 1 and the receiving section 3 are capable of transmitting and receiving high-frequency signals, in particular, a signal having a frequency of 300 MHz or higher, and are capable of transmitting and receiving a signal having a frequency specified by, for example, the LTE and/or WiFi standards. The integrated circuit 10 may be a high-frequency integrated circuit capable of handling such high-frequency signals.

FIG. 2 shows an example of an application of the integrated circuit 10 according to the first embodiment. As shown in FIG. 2, the integrated circuit 10 includes a multiplexer 11, a duplexer D, buffers B1, B2, B3, and B4, and a radio frequency (RF) integrated circuit (IC) 12.

The multiplexer 11 is coupled to, for example, an antenna T at a port P11, includes ports P12, P13, and P14, and allows the port P11 to be coupled to one port selected from the ports P12, P13, and P14.

The multiplexer 11 includes switches S1, S2, and S3, which are, for example, transistors. The switch S1 is coupled between the port P11 and the port P12, the switch S2 is coupled between the port P11 and the port P13, and the switch S3 is coupled between the port P11 and the port P14.

The port P12 is coupled to an input of the buffer B1. A signal output from the buffer B1 is supplied to the RFIC 12. The port P13 is coupled to an output of the buffer B2. An input of the buffer B2 receives a signal from the RFIC 12.

The duplexer D is coupled to the port P14, and provides selective coupling between the port P14 and an input of the buffer B3, and between the port P14 and an output of the buffer B4. A signal output from the buffer B3 is supplied to the RFIC 12. An input of the buffer B4 receives a signal from the RFIC 12.

The output section 1, the receiving section 3, and the switch section 2 shown in FIG. 1 may be respectively applied to a first circuit of any type that outputs a signal, a second circuit of any type that transmits the signal, and a third circuit of any type that controls the first circuit and the second circuit to be brought into or out of conduction, which are provided in the integrated circuit 10. As a specific example, the output section 1, the switch section 2, and the receiving section 3 shown in FIG. 1 may be the antenna T, the switch S1, and the buffer B1, respectively, shown in FIG. 2. Alternatively, the output section 1, the switch section 2, and the receiving section 3 shown in FIG. 1 may be the buffer B2, the switch S2, and the antenna T, respectively, shown in FIG. 2.

FIG. 3 shows details of the switch section 2 according to the first embodiment, by means of functional blocks and element symbols.

As shown in FIG. 3, the switch section 2 includes a potential generation circuit 21, a gate potential application circuit 22, a gate switch 23, a pulse generation circuit 24, a discharge switch 25, a resistance (resistor element) R1, and a switch circuit 26.

The switch circuit 26 includes a first end, a second end, and a control node, and brings the first end and the second end into or out of conduction based on a potential received at the control node. The switch circuit 26 may be, as an example, a field effect transistor (FET), and the descriptions below are given and the drawings are shown based on this example.

The potential generation circuit 21 receives a power-supply potential from, for example, outside the integrated circuit 10, and generates a positive potential Vp and a negative potential Vn using the power-supply potential. The positive potential Vp has a magnitude that is sufficiently great to turn on the transistor 26. The negative potential Vn has a magnitude that is sufficiently small to turn off the transistor 26, regardless of the potential of the first port P1 and/or the second port P2. More specifically, the negative potential Vn has a magnitude that is sufficiently small to reliably cut off the transistor 26, regardless of the potential of the first port P1 and/or the second port P2.

The gate potential application circuit 22 receives the positive potential Vp and the negative potential Vn from the potential generation circuit 21. The gate potential application circuit 22 also receives a control signal Cont from the control section 4. The control signal Cont is, for example, a digital signal, and the gate potential application circuit 22 outputs the positive potential Vp or the negative potential Vn at an output node Nvout based on the level of the control signal Cont. The gate potential application circuit 22 outputs the negative potential Vn at the output node Nvout while the control signal Cont is at a first level, and outputs the positive potential Vp at the output node Nvout while the control signal Cont is at a second level. In a more specific example, the gate potential application circuit 22 outputs the negative potential Vn at the output node Nvout while the control signal Cont is at a low level, and outputs the positive potential Vp at the output node Nvout while the control signal Cont is at a high level.

The output node Nvout is coupled to a first end of the gate switch 23. The gate switch 23 further includes a control node and a second end, and brings the first end and the second end into or out of conduction based on the level of a signal received at the control node. The gate switch 23 may be, for example, a transistor such as a FET, and may be a p-type FET. In this case, the first end and the second end of the gate switch 23 respectively form one end and the other end of the current path, and the control node forms a gate electrode.

The second end of the gate switch 23 is coupled to the gate electrode of the transistor 26 via the resistance R1. A potential applied to the gate electrode of the transistor 26 will be referred to as a "gate potential Vg". The first end of the transistor 26 (or, one end of the current path) functions as the first port P1, and the second end of the transistor 26 (or, the other end of the current path) functions as the second port P2.

The second end of the gate switch 23 is also coupled to a first end of the discharge switch 25. The discharge switch 25 further includes a control node and a second end, and brings the first end and the second end into or out of conduction based on the level of a signal received at the control node. The second end of the discharge switch 25 is coupled to a constant-potential node NF. The constant-potential node NF has an intermediate potential between the positive potential Vp and the negative potential Vn, and is, for example, a node of a ground potential Gnd (or, a node of earth potential).

The discharge switch 25 may be, for example, a transistor such as a FET, and may be an n-type FET. In this case, the first end and the second end of the discharge switch 25 respectively form one end and the other end of the current path, and the control node forms a gate electrode.

The control signal Cont is also supplied to the pulse generation circuit 24. The pulse generation circuit 24 includes an output node Npout, generates a pulsed digital signal from the control signal Cont, and outputs the generated pulse signal at the output node Npout. The pulse generation circuit 24 generates a pulse signal over a predetermined period based on the change in level of the control signal Cont. In a more specific example, the pulse generation circuit 24 outputs a high-level signal at the output node Npout over a certain period of time, from when the control signal Cont has changed from a low level to a high level, or when the control signal Cont has changed from a high level to a low level.

A signal Pout at the output node Npout of the pulse generation circuit 24 is supplied to the gate switch 23, and functions as a control signal of the gate switch 23. The signal Pout is also supplied to the discharge switch 25, and functions as a control signal of the discharge switch 25. The gate switch 23 and the discharge switch 25 are exclusively turned on. That is, while the signal Pout is at a first level, the gate switch 23 remains on, and the discharge switch 25 remains off. While the signal Pout is at a second level, the gate switch 23 remains off, and the discharge switch 25 remains on. For example, the first level is a low level, and the second level is a high level.

<1. 2. Operation>

Figure 4:
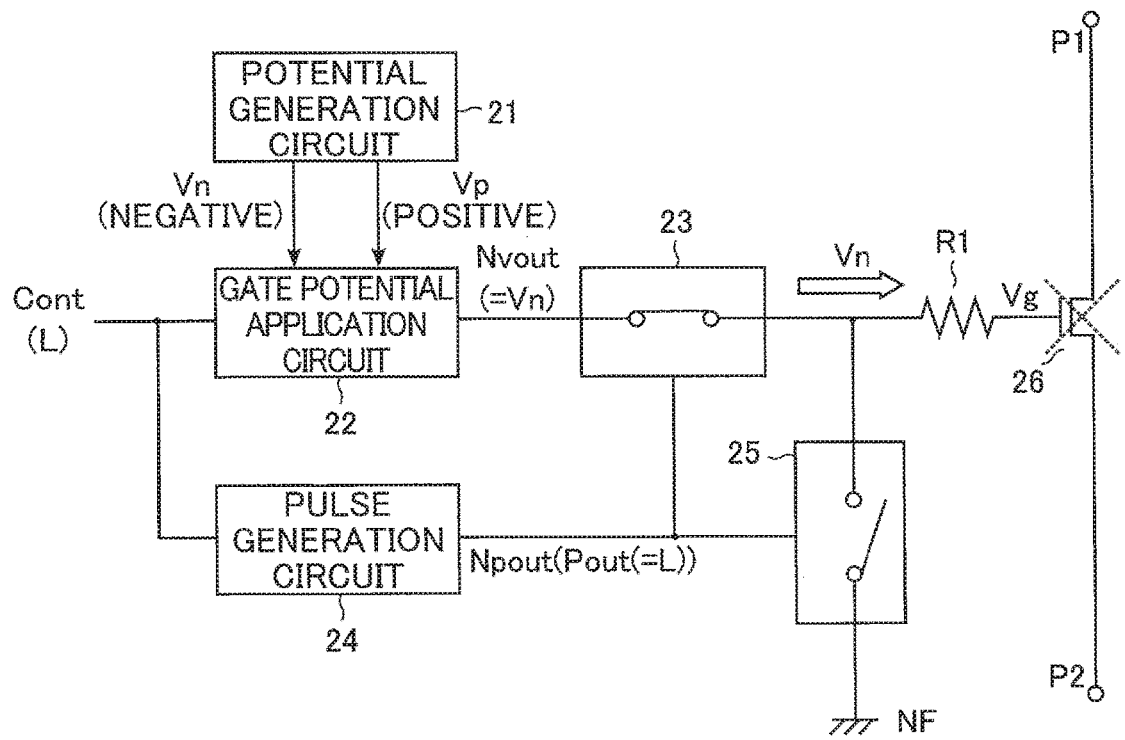
FIG. 4 shows a state of the switch section in operation according to the first embodiment.
Figure 5:
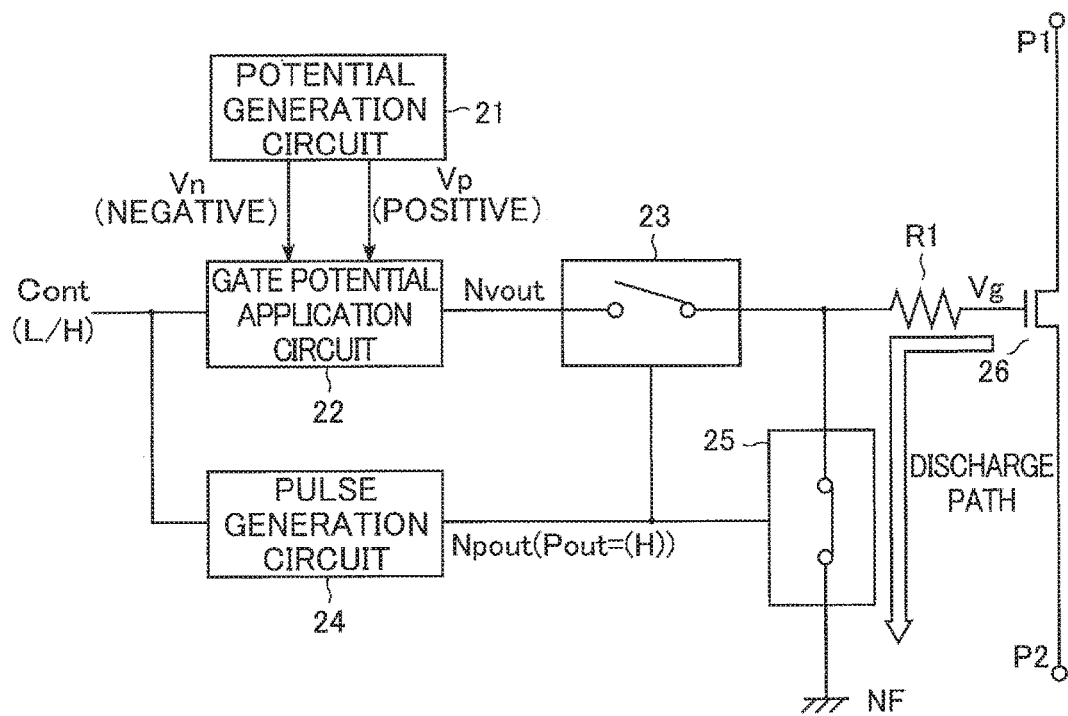
FIG. 5 shows a state of the switch section in operation according to the first embodiment.
Figure 6:
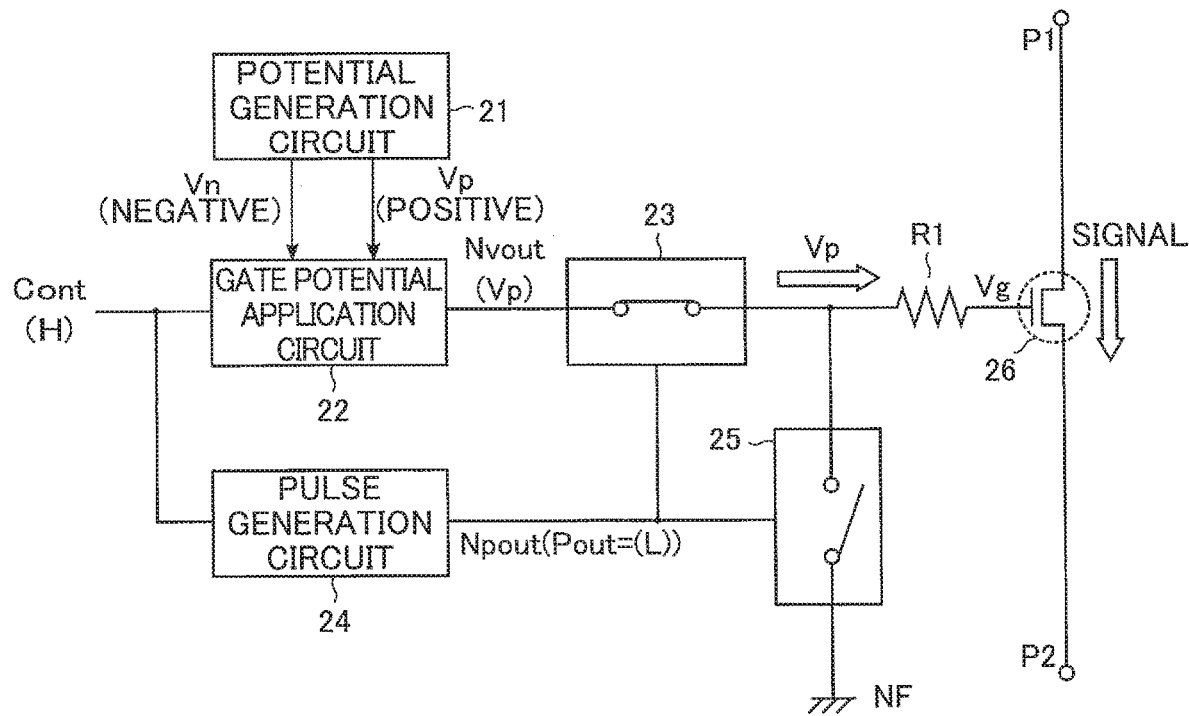
FIG. 6 shows a state of the switch section in operation according to the first embodiment.

Each of FIGS. 4-6 shows a state of the switch section 2 shown in FIG. 3 in operation, according to the first embodiment. FIG. 4 shows a state in which the transistor 26 is kept off. FIG. 5 shows a state that occurs during the switching of the transistor 26 between on and off. FIG. 6 shows a state in which the transistor 26 is kept on.

As shown in FIG. 4, the control signal Cont is at a level that instructs the gate potential application circuit 22 to apply a negative potential Vn, or low level, and thus the output node Nvout has the negative potential Vn. The signal Pout from the pulse generation circuit 24 is at a level that brings the gate switch 23 into conduction (or, turns on the gate switch 23) and brings the discharge switch 25 out of conduction (or, turns off the discharge switch 25), or low level, and thus the gate switch 23 remains on and the discharge switch 25 remains off. Accordingly, the negative potential Vn is applied to the gate of the transistor 26, and the transistor 26 remains off. As described above, the negative potential Vn has a magnitude that is sufficiently small to turn off the transistor 26, regardless of the magnitude of the potential of the first port P1 and/or the second port P2, and the transistor 26 sufficiently separates the first port P1 and the second port P2.

As shown in FIG. 5, the signal Pout is at a level that turns off the gate switch 23 and turns on the discharge switch 25, or low level, and thus the gate switch 23 remains off and the discharge switch 25 remains on. The level of the control signal Cont may be either a high level or a low level. In either case, the gate switch 23 remains off and a component to which the gate of the transistor 26 is coupled assumes a high-impedance state, and the gate switch 23 assumes a high-impedance state as compared to the impedance of while the gate switch 23 remains on. Thus, the potential at the output node Nvout is not applied to the gate of the transistor 26. Instead, the gate of the transistor 26 is coupled to the constant-potential node NF (e.g., the ground) via the discharge switch 25.

As shown in FIG. 6, the control signal Cont is at a level that instructs the gate potential application circuit 22 to apply a positive potential Vp, or low level, and thus the output node Nvout has the positive potential Vp. The signal Pout from the pulse generation circuit 24 is at a level that turns on the gate switch 23 and turns off the discharge switch 25, and thus the gate switch 23 remains on and the discharge switch 25 remains off. Accordingly, the positive potential Vp is applied to the gate of the transistor 26, the transistor 26 remains on, and the transistor 26 electrically couples the first port P1 and the second port P2.

Figure 7:
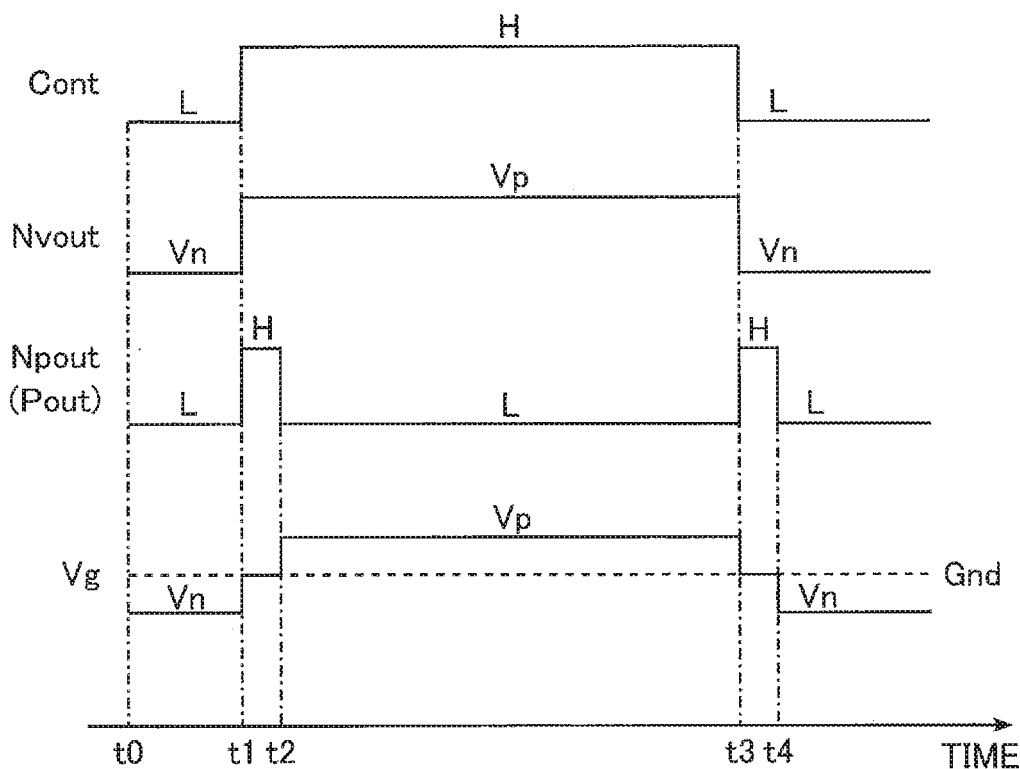
FIG. 7 shows a signal and potentials of some nodes of the switch section along the timeline, according to the first embodiment.

FIG. 7 shows potentials of some nodes and a signal of the switch section 2 along the timeline, according to the first embodiment. The potentials and signal in FIG. 7 are merely shown as an example to illustrate the control of switching between several states, including the states shown in FIGS. 4, 5, and 6. In FIG. 7, a delay caused by a change in potential or signal is omitted to facilitate understanding. Waveforms of a signal and some potentials are shown with a delay in another diagram.

At time t0, the control signal Cont is at a low level, and accordingly, the output node Nvout has a negative potential Vn. At time t0, which is after a predetermined period of time has elapsed since a change of the control signal Cont to the low level prior to time t0, the potential (signal Pout) of the node Npout is at a low level accordingly. Thus, the discharge switch 25 remains off and separated from the constant-potential node NF, the gate switch 23 remains on and the potential of the output node Nvout is applied to the gate of the transistor 26, and the gate potential Vg of the transistor 26 is a negative potential Vn.

The state from time t0 to time t1 following thereafter corresponds to the state of FIG. 4.

At time t1, the control signal Cont changes to a high level. With this change, the potential of the output node Nvout changes to the positive potential Vp. Due to the change in level of the control signal Cont, the signal Pout changes to the high level from time t1. The high level of the signal Pout continues until time t2.

With the change of the signal Pout to the high level, the gate switch 23 is turned off, the gate of the transistor 26 is separated from the output node Nvout of the gate potential application circuit 22, and the gate switch 23 assumes a high-impedance state as compared to the impedance of the gate of the transistor 26. With the change of the signal Pout to the high level, the discharge switch 25 is turned on, and the gate of the transistor 26 is coupled to the constant-potential node NF. As described above, the potential of the constant-potential node NF has a magnitude between the positive potential Vp and the negative potential Vn, and is, for example, the ground potential Gnd. Thus, the gate potential Vg is discharged toward the constant potential, and reaches the state of being the ground potential Gnd. FIG. 4 shows an example in which the constant potential is the ground potential Gnd, and the descriptions below are given based on this example. The state from time t1 to time t2 corresponds to the state of FIG. 5.

At time t2, the control signal Pout changes to a low level. With the change of the signal Pout to the low level, the discharge switch 25 is turned off, and the discharge of the gate potential Vg via the discharge switch 25 is ended. With the change of the signal Pout to the low level, the gate switch 23 is turned on, and the gate of the transistor 26 is electrically coupled to the output node Nvout of the gate potential application circuit 22. Consequently, the potential at the output node Nvout of the gate potential application circuit 22 is transferred to the gate of the transistor 26, and the gate potential Vg rises to the positive potential Vp. The state at time t2 continues until time t3. The state from time t2 to time t3 corresponds to the state of FIG. 6.

At time t3, the control signal Cont changes to a low level. With this change, the potential of the output node Nvout changes to the negative potential Vn. Due to the change in level of the control signal Cont, the signal Pout changes to the high level from time t3. The high level of the signal Pout continues until time t4.

With the change of the signal Pout to the low level, the gate switch 23 is turned off, the gate of the transistor 26 is separated from the output node Nvout of the gate potential application circuit 22, and the gate switch 23 assumes a high-impedance state as compared to the impedance of the gate of the transistor 26. The discharge switch 25 is turned on. At this time, the states of the gate switch 23 and the discharge switch 25 are the same as those shown in FIG. 5. Since the gate switch 23 is turned off and the discharge switch 25 is turned on, the gate potential Vg is discharged and becomes the ground potential Gnd. The state at time t3 continues until time t4.

At time t4, the signal Pout changes to a low level. With the change of the signal Pout to the low level, the discharge switch 25 is turned off, and the discharge of the gate potential Vg via the discharge switch 25 is ended. With the change of the signal Pout to the low level, the gate switch 23 is turned on, and the gate of the transistor 26 is electrically coupled to the output node Nvout of the gate potential application circuit 22. Consequently, the potential at the output node Nvout of the gate potential application circuit 22 is transferred to the gate of the transistor 26, and the gate potential Vg drops to the negative potential Vn. The state at time t4 and thereafter corresponds to the state of FIG. 4.

Figure 8:
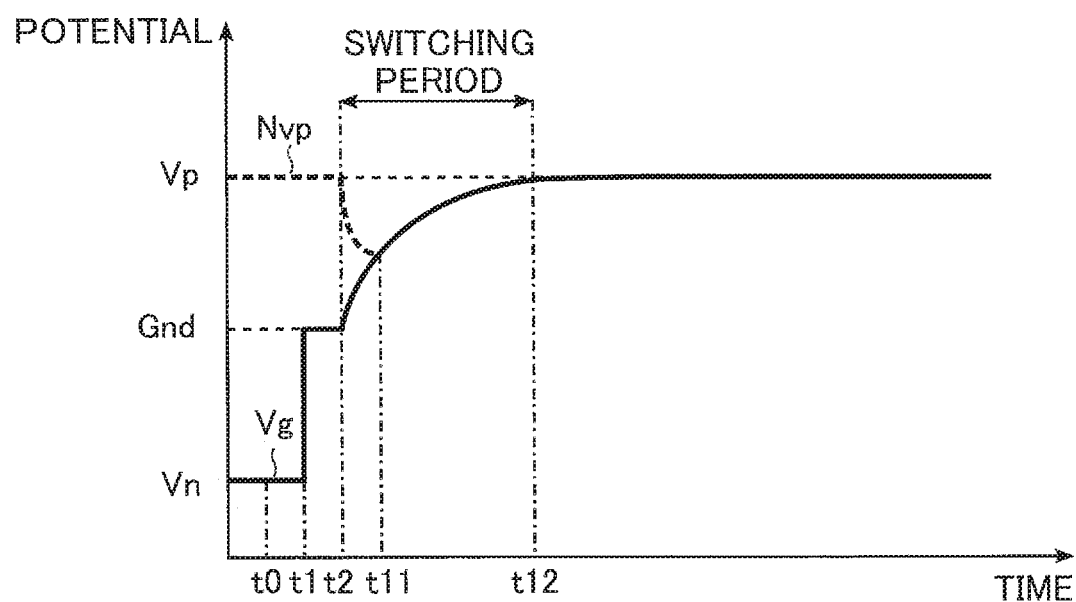
FIG. 8 shows in detail potentials of some nodes of the switch section along the timeline, according to the first embodiment.

FIG. 8 shows in detail potentials of some nodes of the switch section 2 along the timeline, according to the first embodiment. FIG. 8 shows a period from time t0 to time t3.

An output node Nvp shown in FIG. 8 is a node that outputs a positive potential Vp of the potential generation circuit 21. The output node Nvp has a positive potential Vp at time t0.

At time t1, the gate of the transistor 26 is coupled to a node of the ground potential Gnd via the discharge switch 25. Thus, the negative charges at the gate of the transistor 26 flow into the ground, and the gate potential Vg promptly rises from the negative potential Vn to the ground potential Gnd.

During the period from time t1 to time t2, the output node Nvp is not coupled to the gate of the transistor 26, and retains the positive potential Vp.

At time t2, the coupling of the gate of the transistor 26 to the node of the ground potential Gnd via the discharge switch 25 is ended, and the gate of the transistor 26 is coupled to the output node Nvp. Thus, the positive charges at the output node Nvp flow into the gate of the transistor 26, and the potential of the output node Nvp temporarily drops. With the flow of the positive charges into the gate of the transistor 26, the gate potential Vg rises from time t2.

The gate potential Vg and the potential of the output node Np rise at a slope that depends on the time constant, which depends the components of the switch section 2, after the gate potential Vg and the potential of the output node Nvp become equal at time t11, and reaches the positive potential Vp at time t12. The period from time t1 until time t12 will be referred to as a "switching period".

<1. 3. Advantages>

According to the first embodiment, it is possible to provide an integrated circuit 10 including a switch section 2 with a short switching period, as will be described below.

Figure 9:
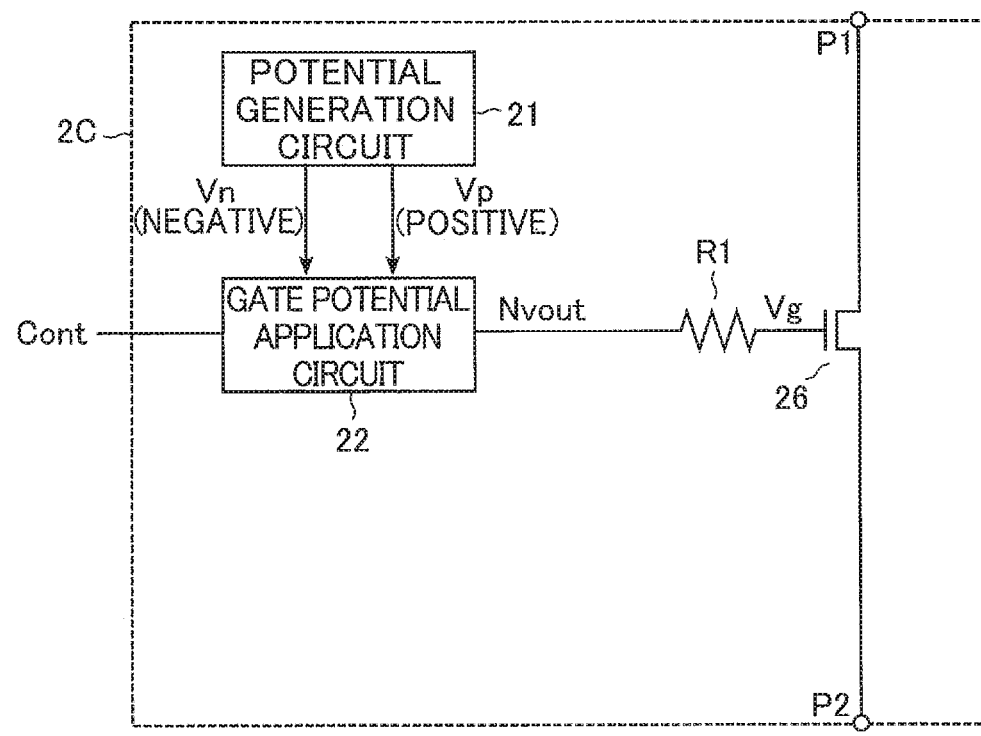
FIG. 9 shows a switch section for reference.

FIG. 9 shows a switch section 2C for reference. As shown in FIG. 9, the switch section 2C controls a first port P1 and a second port P2 to be brought into conduction or out of conduction, as in the switch section 2 of FIG. 3. However, the switch section 2C does not include a gate switch 23, a pulse generation circuit 24, or a discharge switch 25, unlike the switch section 2. In addition, an output node Nvout of a gate potential application circuit 22 is directly coupled to a resistance R1.

Figure 10:
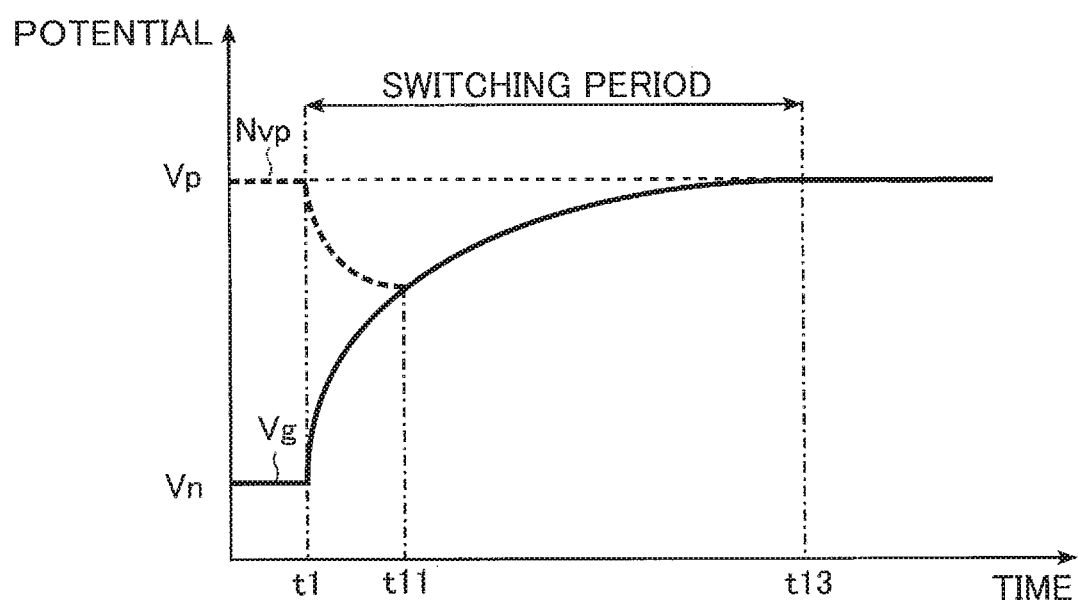
FIG. 10 shows potentials of some nodes of the switch section for reference along the timeline.

FIG. 10 shows in detail potentials of some nodes of the switch section 2C along the timeline. More specifically, FIG. 10 shows a period around time t1, when a control signal Cont changes from a low level to a high level.

At time t1, a negative potential Vn is applied to a gate potential Vg. With the change of the control signal Cont from the low level to the high level at time t1, the potential of the output node Nvout changes from the negative potential Vn to a positive potential Vp. In accordance therewith, the gate potential Vg rises from the negative potential Vn toward the positive potential Vp.

It is a potential generation circuit 21 that changes the potential of the gate potential Vg, and the potential generation circuit 21 raises the gate potential Vg from the negative potential Vn to the positive potential Vp, using a positive potential Vp generated from, for example, the power-supply potential. Thus, the rise in the gate potential Vg takes time, and the gate potential Vg reaches the positive potential Vp at time t13 after time t12 in FIG. 9. That is, the switching period extends from time t1 to time t13, and is longer than the switching period in the case of the first embodiment (FIG. 8).

According to the first embodiment, immediately before a potential to be applied to the gate of the transistor 26 is switched between a negative potential Vn and a positive potential Vp, the gate is decoupled from the output node Nvout of the gate potential application circuit 22, and is coupled, via the discharge switch 25, to a node of an intermediate potential between the negative terminal Vn and the positive potential Vp, e.g., a node of the ground potential Gnd in a typical example. Thus, at the point in time when the negative potential Vn or the positive potential Vp, to which the switching is made, is applied to the gate, the gate is already discharged to a potential of the constant-potential node NF (e.g., the ground potential Gnd). Accordingly, the gate potential Vg reaches the target potential promptly after the application of the positive potential Vp or the negative potential Vn, to which the switching is made, to the gate of the transistor 26. Thus, the switching period of the transistor 26 is shorter than that of the reference example shown in FIGS. 9 and 10, and allows the transistor 26 to be turned on and off at high speed.

Second Embodiment

A second embodiment differs from the first embodiment in terms of configuration for realizing an operation similar to that of the switch section 2 in the first embodiment. Hereinafter, the description will focus mainly on features which differ from those of the first embodiment.

FIG. 11 shows details of a switch section 2 according to the second embodiment, by means of functional blocks and element symbols. In the description that follows, the switch section 2 of the second embodiment will be referred to as a "switch section 2a", as distinguished from the switch section 2 of the first embodiment.

As shown in FIG. 11, the switch section 2a includes a gate potential application circuit 31 instead of the gate potential application circuit 22 of the switch section 2 in the first embodiment shown in FIG. 3, and does not include a gate switch 23 or a pulse generation circuit 24.

The gate potential application circuit 31 is configured to remain in one state selected from three states. Specifically, the gate potential application circuit 31 receives a positive potential Vp and a negative potential Vn from a potential generation circuit 21, as in the first embodiment, and remains in a first state or a second state based on a control signal Cont. In the first state and the second state, the gate potential application circuit 31 outputs the positive potential Vp and the negative potential Vn, respectively, at an output node Nvout. In a third state, the gate potential application circuit 31 is in a high-impedance state at the output node Nvout, and is in a state of having a higher impedance than that of the output node Nvout in the first and second states. Hereinafter, the state in which the gate potential application circuit 31 is in the high-impedance state at the output node Nvout may be referred to as the gate potential application circuit 31 being in a "high output impedance state".

The gate potential application circuit 31 is in a high-impedance state, namely, a third state over a predetermined period from a change in level of the control signal Cont. The gate potential application circuit 31 outputs the negative potential Vn at the output node Nvout while the control signal Cont is at a first level, and outputs the positive potential Vp at the output node Nvout while the control signal Cont is at a second level, as in the first embodiment. More specifically, the gate potential application circuit 31 outputs the negative potential Vn at the output node Nvout while the control signal Cont is at a low level, and outputs the positive potential Vp at the output node Nvout while the control signal Cont is at a high level.

The output node Nvout of the gate potential application circuit 31 is coupled to a gate of a transistor 26 via a resistance R1.

The gate potential application circuit 31 includes a node Npout, generates a digital signal Pout from the control signal Cont, and outputs the signal Pout at the node Npout. The signal Pout is supplied to a control node of a discharge switch 25. The signal Pout is at a low level while the gate potential application circuit 31 is in either the first state or the second state, and remains at a high level while the gate potential application circuit 31 is in the third state (or, in the high output impedance state).

The same operation that can be realized by the switch section 2 of the first embodiment can also be realized by the switch section 2a. For example, as the control signal Cont changes over time as in FIG. 7 of the first embodiment, so the signals Vout and Pout and the gate potential Vg also change over time in the second embodiment.

Figure 13:
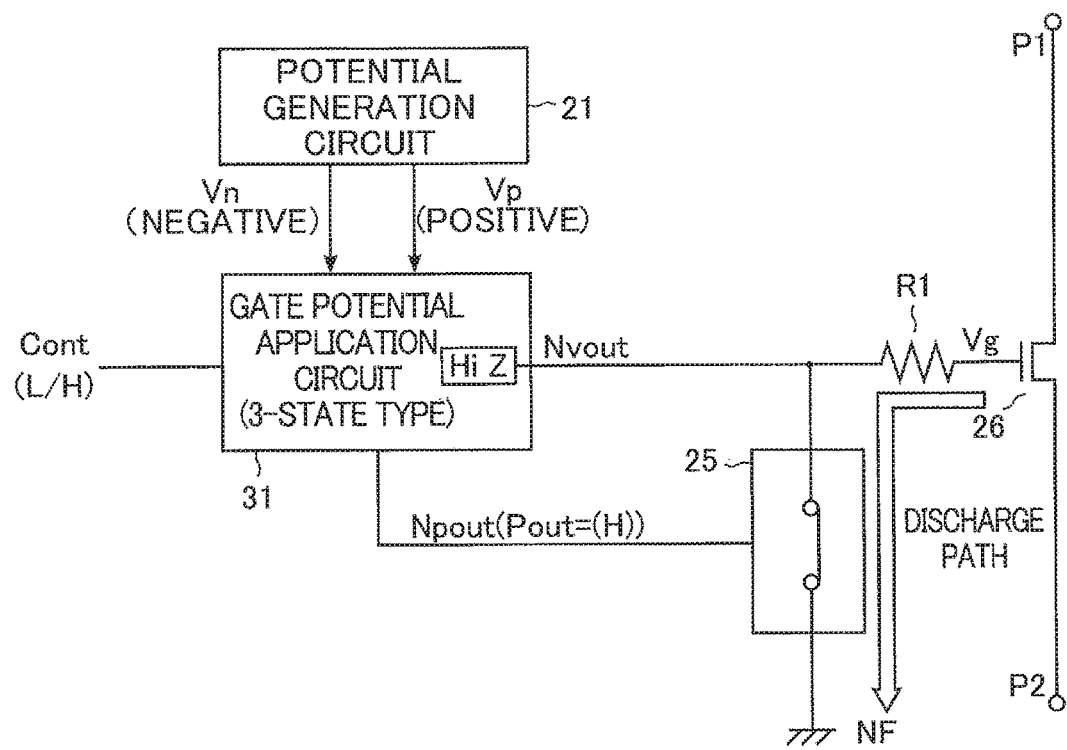
FIG. 13 shows a state of the switch section in operation according to the second embodiment.
Figure 14:
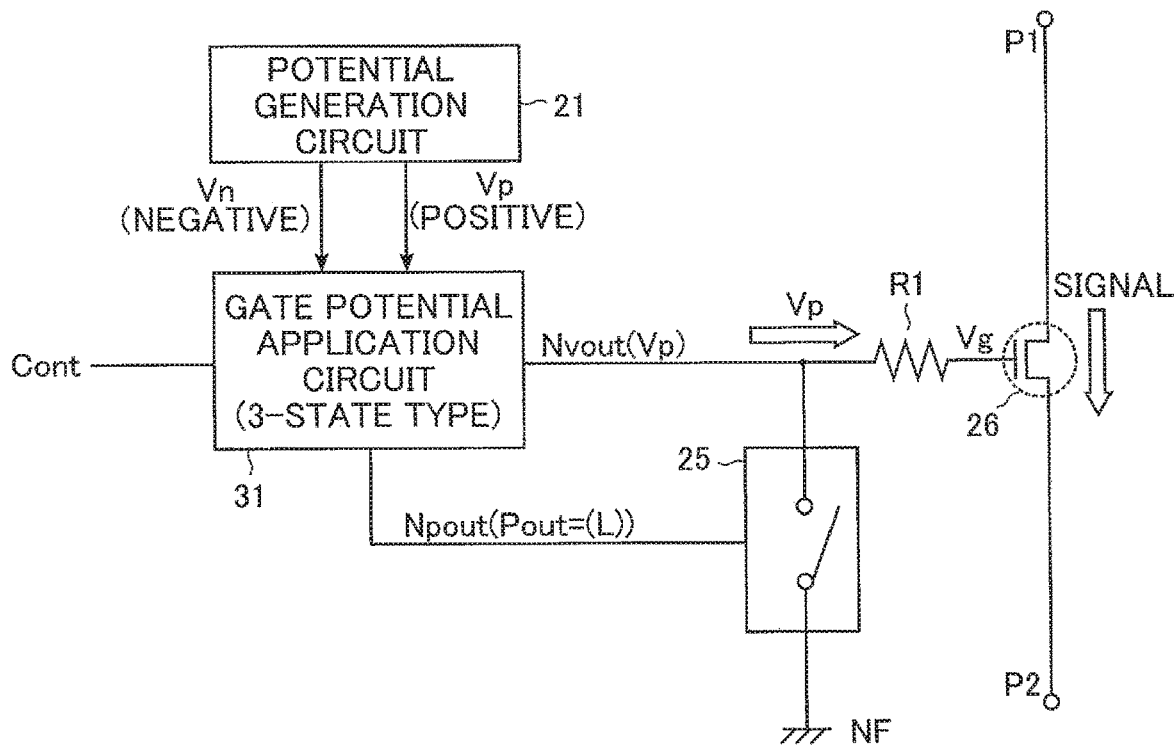
FIG. 14 shows a state of the switch section in operation according to the second embodiment.

Each of FIGS. 12-14 shows a state of the switch section 2a shown in FIG. 11 in operation, according to the second embodiment. FIG. 12 shows a state in which the transistor 26 remains off. FIG. 13 shows a state that occurs during the switching of the transistor 26 between on and off. FIG. 14 shows a state in which the transistor 26 remains on.

As shown in FIG. 12, the control signal Cont is at a level that instructs the gate potential application circuit 31 to apply a negative potential Vn, or low level, and thus the output node Nvout has the negative potential Vn. The signal Pout from the gate potential application circuit 31 is at a level that turns off the discharge switch 25, or low level, and thus the discharge switch 25 remains off. Accordingly, the negative potential Vn is applied to the gate of the transistor 26, and the transistor 26 remains off.

As shown in FIG. 13, the signal Pout is at a level that turns on the discharge switch 25, or high level. Accordingly, the gate of the transistor 26 is coupled to the node of the ground potential Gnd via the discharge switch 25. While the signal Pout is at the level that turns on the discharge switch 25, the gate potential application circuit 31 is in the high output impedance state. This suppresses the charges at the gate of the transistor 26 from flowing into the gate potential application circuit 31 from the output node Nvout.

As shown in FIG. 14, the control signal Cont is at a level that instructs the gate potential application circuit 31 to apply a positive potential Vp, or high level, and thus the output node Nvout has a positive potential Vp. The signal Pout is at a level that turns off the discharge switch 25, or high level, and thus the discharge switch 25 remains off. Accordingly, a positive potential Vp is applied to the gate of the transistor 26, and the transistor 26 remains on.

Next, an example of a specific configuration of the gate potential application circuit 31 will be described.

FIGS. 15-18 are circuit diagrams which illustrate a part of an example of the gate potential application circuit 31 according to the second embodiment. As shown in FIG. 15, the gate potential application circuit 31 includes p-type. MOSFETs TP1, TP2, TP3, TP4, TP5, and TP6, and n-type MOSFETs TN1, TN2, TN3, TN4, TN5, and TN6, and resistances R11, R12, R13, and R14, and an inverter circuit IV1.

The resistance R11 and the transistor TP1 are serially coupled in this order between a node N11, which receives the positive potential Vp, and a node N12. The node N12 is coupled to a first end of the transistor TN1, and a second end of the transistor TN1 is coupled to a node of the ground potential Gnd. A gate of the transistor TN1 is coupled to a node d1.

The resistance R12 and the transistor TP2 are serially coupled in this order between the node N11 and the node N13. A gate of the transistor TP2 is coupled to the node N12. The node N13 is coupled to a gate of the transistor TP1 and coupled to a first end of the transistor TN2. A second end of the transistor TN2 is coupled to a node of the ground potential Gnd, and a gate of the transistor TN2 is coupled to a node d2.

The transistor TP3 is coupled between a node d3 and a node N14. A gate of the transistor TP3 is coupled to the node of the ground potential Gnd. The transistor TN3 and the resistance R13 are serially coupled in this order between the node N14 and the node N15, which receives the negative potential Vn.

A transistor TP4 is coupled between a node d4 and a node N16. A gate of the transistor TP4 is coupled to the node of the ground potential Gnd. The node N16 is coupled to a gate of the transistor TN3. The transistor TN4 and the resistance R14 are serially coupled in this order between the node N16 and the node N15. A gate of the transistor TN4 is coupled to a node N14.

The transistors TP5 and TN5 are serially coupled in this order between the node N11 and the node of the ground potential Gnd. The transistors TP5 and TN5 are coupled via a node Nx. A gate of the transistor TP5 and a gate of the transistor TN5 are coupled to the node N12. The node Nx is coupled to a node of the inverter circuit IV1 which receives the higher power-supply potential.

The transistors TP6 and TN6 are serially coupled in this order between the node N15 and the node of the ground potential Gnd. The transistors TP6 and TN6 are coupled via a node Ny. A gate of the transistor TP6 and a gate of the transistor TN6 are coupled to the node N14. The node Ny is coupled to a node of the inverter circuit IV1 which receives the lower power-supply potential.

The input of the inverter circuit IV1 is coupled to the node of the ground potential Gnd, and the output of the inverter circuit IV1 functions as an output node Nvout of the gate potential application circuit 31.

Figure 16:
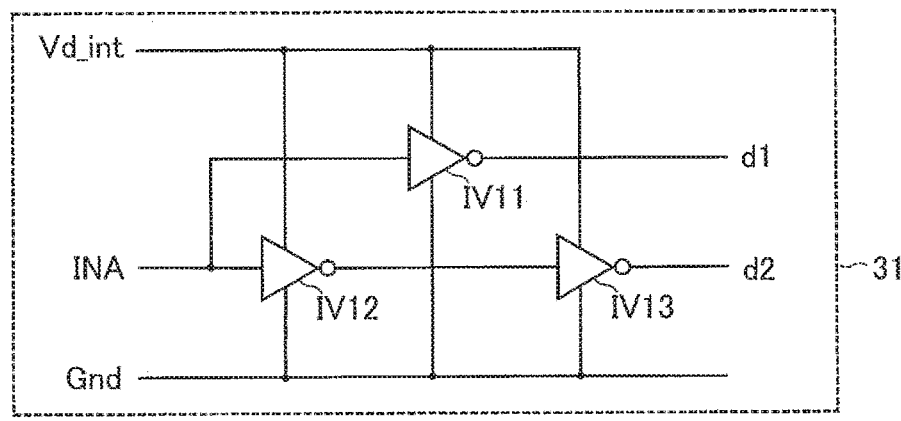
FIG. 16 is a circuit diagram illustrating a part of an example of the gate potential application circuit according to the second embodiment.

As shown in FIG. 16, the gate potential application circuit 31 further includes inverter circuits IV11, IV12, and IV13. In each of the inverter circuits IV11, IV12, and IV13, a node which receives the higher power-supply potential is coupled to a node of an inner power-supply potential Vd_int, and a node which receives the lower power-supply potential is coupled to the node of the ground potential Gnd.

An input of the inverter circuit IV11 is coupled to the node INA, and an output of the inverter circuit IV11 functions as a node d1. An input of the inverter circuit IV12 is coupled to the node INA, and an output of the inverter circuit IV12 is coupled to the inverter circuit IV13. An output of the inverter circuit IV13 functions as the node d2.

Figure 17:
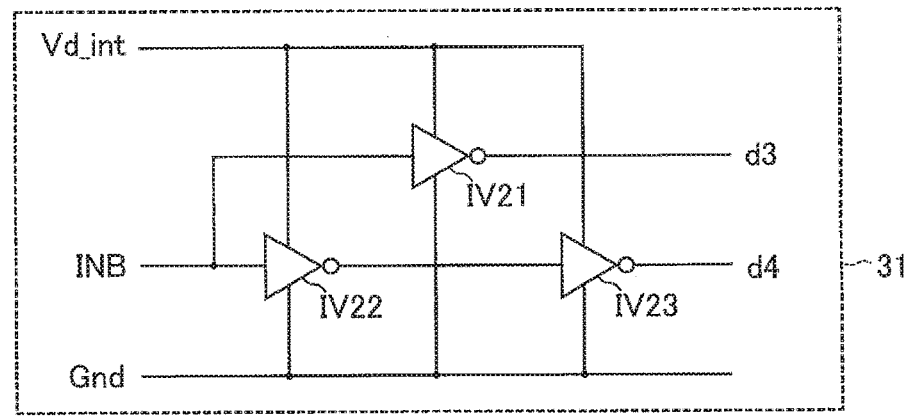
FIG. 17 is a circuit diagram illustrating a part of an example of the gate potential application circuit according to the second embodiment.

As shown in FIG. 17, the gate potential application circuit 31 further includes inverter circuits IV21, IV22, and IV23. In each of the inverter circuits IV21, IV22, and IV23, a node which receives the higher power-supply potential is coupled to a node of the inner power-supply potential Vd_int, and a node which receives the lower power-supply potential is coupled to the node of the ground potential Gnd.

An input of the inverter circuit IV21 is coupled to the node INB, and an output of the inverter circuit IV21 functions as the node d3. An input of the inverter circuit IV22 is coupled to the node INB, and an output of the inverter circuit IV22 is coupled to the inverter circuit IV23. An output of the inverter circuit IV23 functions as the node d4.

Figure 18:
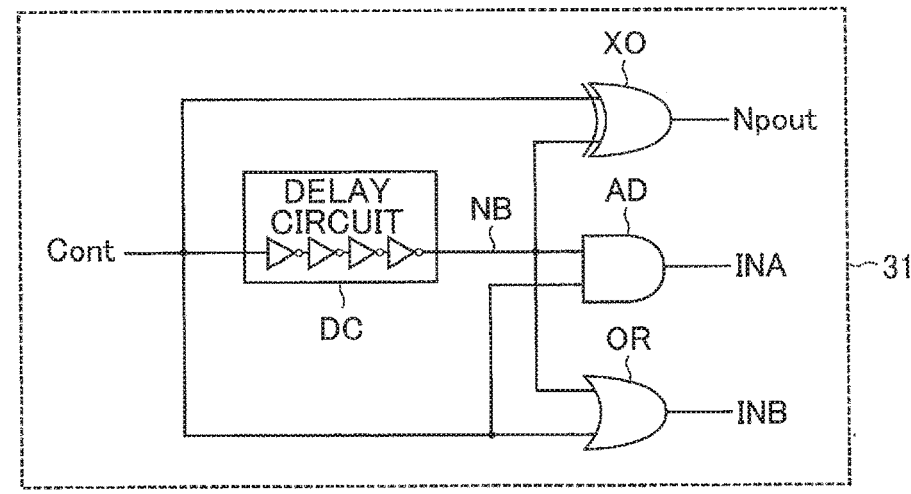
FIG. 18 is a circuit diagram illustrating a part of an example of the gate potential application circuit according to the second embodiment.

As shown in FIG. 18, the gate potential application circuit 31 further includes a delay circuit DC, an exclusive OR (XOR) gate XO, a logical conjunction (AND) gate AD, and a logical disjunction (OR) gate OR.

The delay circuit DC receives the control signal Cont, and outputs, at a node NB, a signal obtained by delaying the control signal Cont by a certain period of time.

The XOR gate XO receives the control signal Cont at a first input, and is coupled to the node NB at a second input. An output of the XOR gate XO functions as a node Npout.

The AND gate AD is coupled to the node NB at a first input, and receives a control signal Cont at a second input. An output of the AND gate AD functions as a node INA.

The OR gate OR is coupled to the node NB at a first input, and receives a control signal Cont at a second input. An output of the OR gate OR functions as a node INB.

Figure 19:
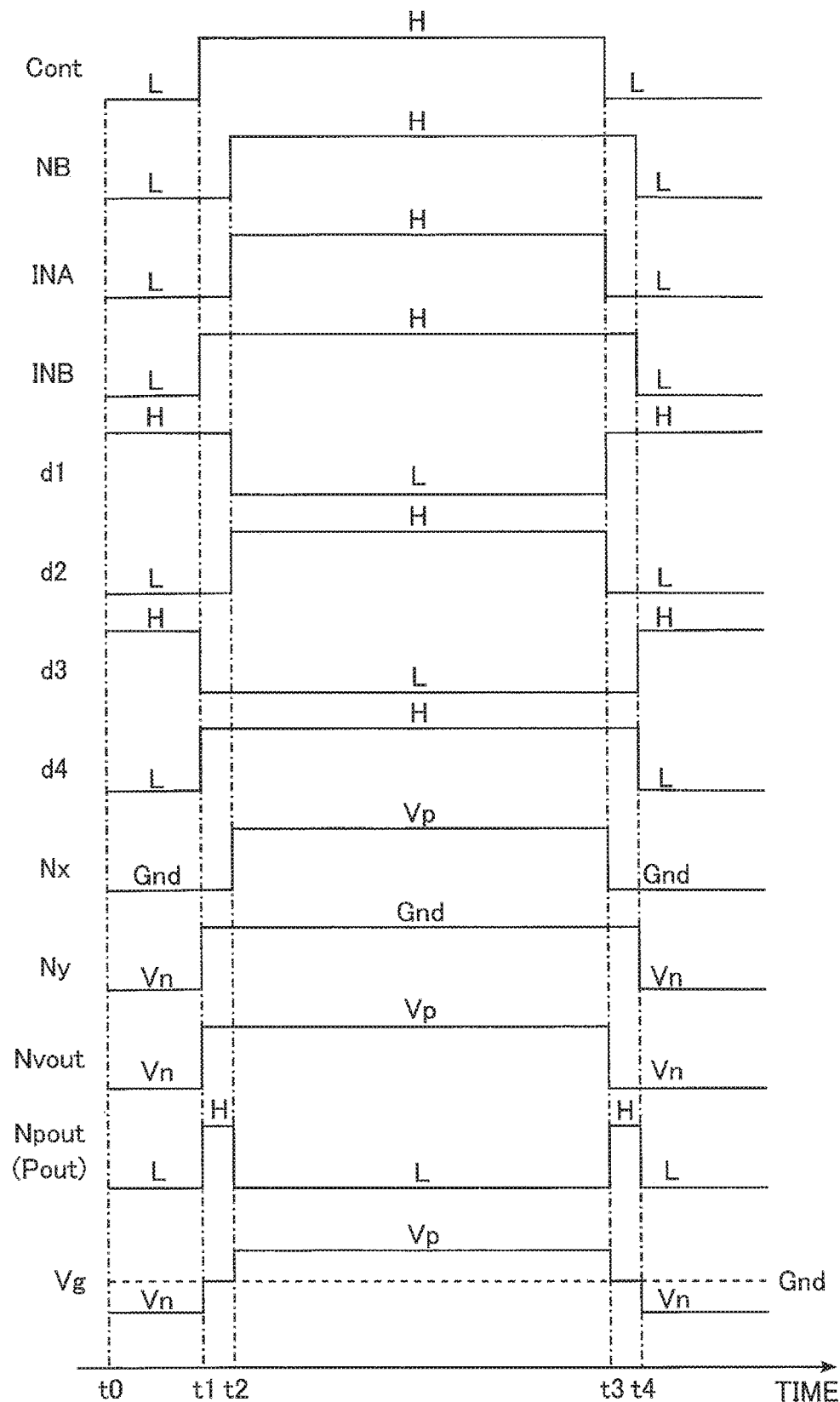
FIG. 19 shows a signal and potentials of some nodes of the switch section along the timeline, according to the second embodiment.

FIG. 19 shows a signal and potentials of some nodes of the switch section 2a along the timeline, according to the second embodiment.

As shown in FIG. 19, the control signal Cont is kept at a low level over the period from time t0 to time t1 and the period of time t3 and thereafter, and is kept at a high level over the period from time t1 to time t3, as in FIG. 7 of the first embodiment. With such a change in level of the control signal Cont, the potentials of the other nodes change in a manner described below.

A signal at the node NB is at a low level over the period from time t0 to time t2 and the period of time t4 and thereafter, and is at a high level over the period from time t2 to time t4. A signal at the node INA is at a low level over the period from time t0 to time t2 and the period of time t3 and thereafter, and is at a high level over the period from time t2 to time t3. A signal at the node INB is at a low level over the period from time t0 to time t1 and the period of time t4 and thereafter, and is at a high level over the period from time t1 to time t4.

A signal at the node d1 is at a high level over the period from time t0 to time t2 and the period of time t3 and thereafter, and is at a low level over the period from time t2 to time t3. A signal at the node d2 is at a low level over the period from time t0 to time t2 and the period of time t3 and thereafter, and is at a high level over the period from time t2 to time t3. A signal at the node d3 is at a high level over the period from time t0 to time t1 and the period of time t4 and thereafter, and is at a low level over the period from time t1 to time t4. A signal at the node d4 is at a low level over the period from time t0 to time t1 and the period of time t4 and thereafter, and is at a high level over the period from time t1 to time t4.

With such changes in signals at the nodes NB, INA, INB, d1, d2, d3, and d4, the node Nx has a ground potential Gnd over the period from time t0 to time t2 and the period of time t3 and thereafter, and has a positive potential Vp over the period from time t2 to time t3. The node Ny has a negative potential Vn over the period from time t0 to time t1 and the period of time t4 and thereafter, and has a ground potential Gnd over the period from time t1 to time t4. With such changes in potentials at the nodes Nx and Ny, the output node Nvout has a negative potential Vn over the period from time t0 to time t1 and the period of time t3 and thereafter, and has a positive potential Vp over the period from time t2 to time t3.

Since both the nodes Vx and Vy have the ground potential Gnd over the period from time t1 to time t2 and the period from time t3 to time t4, the inverter circuit IV1 shown in FIG. 11 is not activated, and the output node Nvout assumes a high-impedance state.

With such changes in signals at the nodes NB, INA, and INB, the node Npout is at a low level over the period from time t0 to time t1, the period from time t2 to time t3, and the period of time t4 and thereafter, and is at a high level over the period from time t1 to time t2 and the period from time t3 to time t4, as in FIG. 7 of the first embodiment. Thus, the discharge switch 25 remains on during the period from time t1 to time t2, and during the period from time t3 to time t4.

With the above-described changes in potentials at the node Npout and the output node Nvout, the gate potential Vg has a negative potential Vn over the period from time t0 to time t1 and the period of time t4 and thereafter, has a ground potential Gnd over the period from time t1 to time t2 and the period from time t3 to time t4, and has a positive potential Vp over the period from time t2 to time t3. Such changes in potentials are the same as those described in the first embodiment (with reference to FIG. 7).

According to the second embodiment, as in the first embodiment, immediately before a potential to be applied to the gate of the transistor 26 is switched between a negative potential Vn and a positive potential Vp, the output node Nvout of the gate potential application circuit 31 coupled to the gate assumes a high-impedance state, and is coupled to a node of an intermediate potential between the negative terminal Vn and the positive potential Vp, e.g., a node of the ground potential Gnd in a typical example. Thus, the second embodiment offers the same advantageous features as can be obtained by the first embodiment.

While certain embodiments have been described, these embodiments have been presented by way of example only, and are not intended to limit the scope. Indeed, the novel embodiments described herein may be embodied in a variety of other forms; furthermore, various omissions, substitutions and changes in the form of the embodiments described herein may be made without departing from the spirit. The accompanying claims and their equivalents are intended to cover such forms or modifications as would fall within the scope and spirit.

What is claimed is:
1. A high-frequency integrated circuit comprising:
  a first switch circuit which controls conduction between a first node and a second node according to a potential applied to a first control node;

a second switch circuit which controls conduction between the first control node and a first potential node according to a potential applied to a second control node; and a first circuit including a first output node coupled to the first control node and a second output node coupled to the second control node, the first circuit outputting, at the second output node, a first potential that brings the second switch circuit out of conduction during a period of outputting a second potential at the first output node, the first circuit having a first impedance at the first output node during the period of outputting the second potential at the first output node, the first circuit having a second impedance at the first output node during a period of outputting, at the second output node, a third potential that brings the second switch circuit into conduction, the second impedance being higher than the first impedance, wherein the first circuit comprises
  a first potential circuit which outputs the second potential at a third node;
  a third switch circuit between the third node and the first output node, the third switch circuit being brought into conduction exclusively with the second switch circuit; and
  a second circuit including the second output node.

2. The high-frequency integrated circuit according to claim 1, wherein:
the third switch circuit is brought into or out of conduction according to a potential of the second control node,
the first circuit outputs, at the second output node, the first potential during a period of outputting the second potential at the first output node, and during a period of outputting a fourth potential at the first output node,
a potential of the first potential node is lower than the second potential and higher than the fourth potential.

3. The high-frequency integrated circuit according to claim 2, wherein:
the second potential is a positive potential, and the fourth potential is a negative potential.

4. The high-frequency integrated circuit according to claim 3, wherein:
the potential of the first potential node is a ground potential.

5. The high-frequency integrated circuit according to claim 4, wherein:
the first switch circuit is a field effect transistor.

6. The high-frequency integrated circuit according to claim 1, wherein
the first potential circuit outputs the second potential or the fourth potential at the third node, based on a level of a first signal, and
the second circuit generates, at the second output node, a potential of a first level over a first period since a change in the level of the first signal.

7. The high-frequency integrated circuit according to claim 6, wherein:
the second potential is a positive potential, and the fourth potential is a negative potential.

8. The high-frequency integrated circuit according to claim 7, wherein:
the potential of the first potential node is a ground potential.

9. A high-frequency integrated circuit comprising:
a first switch circuit which controls conduction between a first node and a second node according to a potential applied to a first control node;
a second switch circuit which controls conduction between the first control node and a first potential node according to a potential applied to a second control node; and
a first circuit including a first output node, a second output node, a third node, a third switch circuit, and a first potential circuit, wherein
the first potential circuit outputs a first potential at the third node,
the first output node is coupled to the first control node,
the second output node is coupled to the second control node, and
the third switch circuit is provided between the third node and the first output node, is configured to vary an impedance between the third node and the first output node, and is brought into conduction exclusively with the second switch circuit.

10. The high-frequency integrated circuit according to claim 9, wherein:
the third switch circuit has a first impedance while the first circuit is outputting a potential that brings the second switch circuit into conduction at the second output node,
the third switch circuit has a second impedance while the first circuit is outputting the first potential, and
the first impedance is higher than the second impedance.

11. The high-frequency integrated circuit according to claim 9, wherein:
the first circuit further includes a second circuit that includes the second output node.

12. A high-frequency integrated circuit comprising:
a first switch circuit which controls conduction between a first node and a second node according to a potential applied to a first control node;
a second switch circuit which controls conduction between the first control node and a first potential node according to a potential applied to a second control node; and
a first circuit including a first output node, a second output node, a third node, and a variable impedance circuit, wherein
the first output node is coupled to the first control node,
the second output node is coupled to the second control node,
the variable impedance circuit is provided between the third node and the first output node, and is configured to vary an impedance between the third node and the first output node, and
the impedance between the third node and the first output node becomes low exclusively with an impedance of the second switch circuit.

13. The high-frequency integrated circuit according to claim 12, wherein:
the first circuit further includes a first potential circuit that outputs a first potential to the third node,
the first circuit outputs a potential that brings the second switch circuit out of conduction to the second output node while outputting the first potential to the first output node.

14. The high-frequency integrated circuit according to claim 12, wherein:
the first circuit further includes a fourth node coupled to the variable impedance circuit,
the variable impedance circuit is configured to vary an impedance between the first output node and the fourth node, and the impedance between the first output node and the fourth node becomes low exclusively with the impedance between the third node and the first output node and the impedance of the second switch circuit.

15. The high-frequency integrated circuit according to claim 14, wherein:
the first circuit further includes a first potential circuit that outputs a first potential to the third node and a second potential circuit that outputs a second potential to the fourth node.

* * * * *